United States Patent
New

(10) Patent No.: US 7,107,560 B1
(45) Date of Patent: Sep. 12, 2006

(54) METHOD AND APPARATUS FOR DESIGNING CUSTOM PROGRAMMABLE LOGIC DEVICES

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 82 days.

(21) Appl. No.: 10/407,326

(22) Filed: Apr. 3, 2003

(51) Int. Cl.
*G06F 17/50* (2006.01)

(52) U.S. Cl. ............................. 716/10; 716/16; 716/17

(58) Field of Classification Search ............ 716/18–11, 716/16–17; 326/39–41
See application file for complete search history.

(56) References Cited

U.S. PATENT DOCUMENTS

| | | | | |
|---|---|---|---|---|
| 5,426,769 A | * | 6/1995 | Pawloski | 710/2 |
| 5,612,631 A | * | 3/1997 | Agrawal et al. | 326/39 |
| 5,764,078 A | * | 6/1998 | Agrawal et al. | 326/40 |
| 5,869,981 A | * | 2/1999 | Agrawal et al. | 326/39 |
| 5,883,850 A | * | 3/1999 | Lee et al. | 365/230.03 |
| 6,594,816 B1 | * | 7/2003 | Hauck | 716/18 |
| 2004/0060032 A1 | * | 3/2004 | McCubbrey | 716/16 |

OTHER PUBLICATIONS

U.S. Appl. No. 60/381,295.*
Xilinx, Inc.; "Virtex-II Pro Platform FPGAs: Functional Description"; DS083-2 (v2.5.1); Advance Product Specification; published Mar. 24, 2003; Module 2; available from Xilinx, Inc., 2100 Logic Drive, San Jose, California 95124; pp. 1-45.

* cited by examiner

*Primary Examiner*—Vuthe Siek
(74) *Attorney, Agent, or Firm*—W. Eric Webostad; LeRoy D. Maunu

(57) ABSTRACT

Method and apparatus for designing custom programmable logic devices is described. In an example, a physical layout of programmable logic blocks is obtained. One or more dedicated logic blocks are then selected from a database. A physical size for each of the one or more dedicated logic blocks is obtained. A region within the physical layout for each of the one or more dedicated logic blocks is reserved in response to the respective physical size of each of the one or more dedicated logic blocks. Each or the one or more dedicated logic blocks is the positioned within the respective region reserved.

14 Claims, 3 Drawing Sheets

METHOD AND APPARATUS FOR DESIGNING CUSTOM PROGRAMMABLE LOGIC DEVICES

FIELD OF THE INVENTION

One or more aspects of the invention relate generally to programmable logic devices and, more particularly, to design of programmable logic devices having customized dedicated logic blocks.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

It is often desirable to manufacture FPGAs having custom logic functions specific to a particular customer application. Conventional FPGAs are only customizable through programming (i.e., software). Thus, a manufacturer desiring to implement custom logic functions within an FPGA for a particular customer conventionally implements the custom logic functions in the form of software by using CLBs, IOBs, and the programmable interconnect structure. Unless the software-based custom logic function is encrypted, an engineer having skill in the art may reverse-engineer the software-based custom logic function. Moreover, the bitstream used to configure the FPGA with the software-based custom logic function is susceptible to unauthorized use. For example, the bitstream for implementing a software-based custom logic function may be used to configure PLDs other than those authorized. Furthermore, to maintain the security of the software-based custom logic function, the software must remain physically disjoint from the customer's design, must be separately encrypted from the customer's design, and may not be partially overwritten by the customer's design. Current FPGAs do not support these constraints.

Therefore, there exists a need in the art for design and production of a custom programmable logic device without implementation of software-based custom logic functions.

SUMMARY OF THE INVENTION

Method and apparatus for designing a custom programmable logic device is described. In an embodiment, a physical layout of programmable logic blocks is provided. Programmable logic blocks include, for example, configurable logic blocks, input/output blocks, and programmable routing. One or more dedicated logic blocks are then selected from a database. The one or more dedicated logic blocks include logic circuitry for implementing custom logic functions. A physical size for each of the one or more dedicated logic blocks is obtained. A region within the physical layout for each of the one or more dedicated logic blocks is reserved in response to the respective physical size of each of the one or more dedicated logic blocks. Each of the one or more dedicated logic blocks is positioned within the respective region reserved.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for designing custom programmable logic devices is described. One or more aspects in accordance with the invention are described in terms of field programmable gate arrays (FPGAs). While specific reference is made to FPGAs, those skilled in the art will appreciate that one or more aspects of the invention may be used in other types of programmable logic devices, such as complex programmable logic devices (CPLDs).

Figure 1:
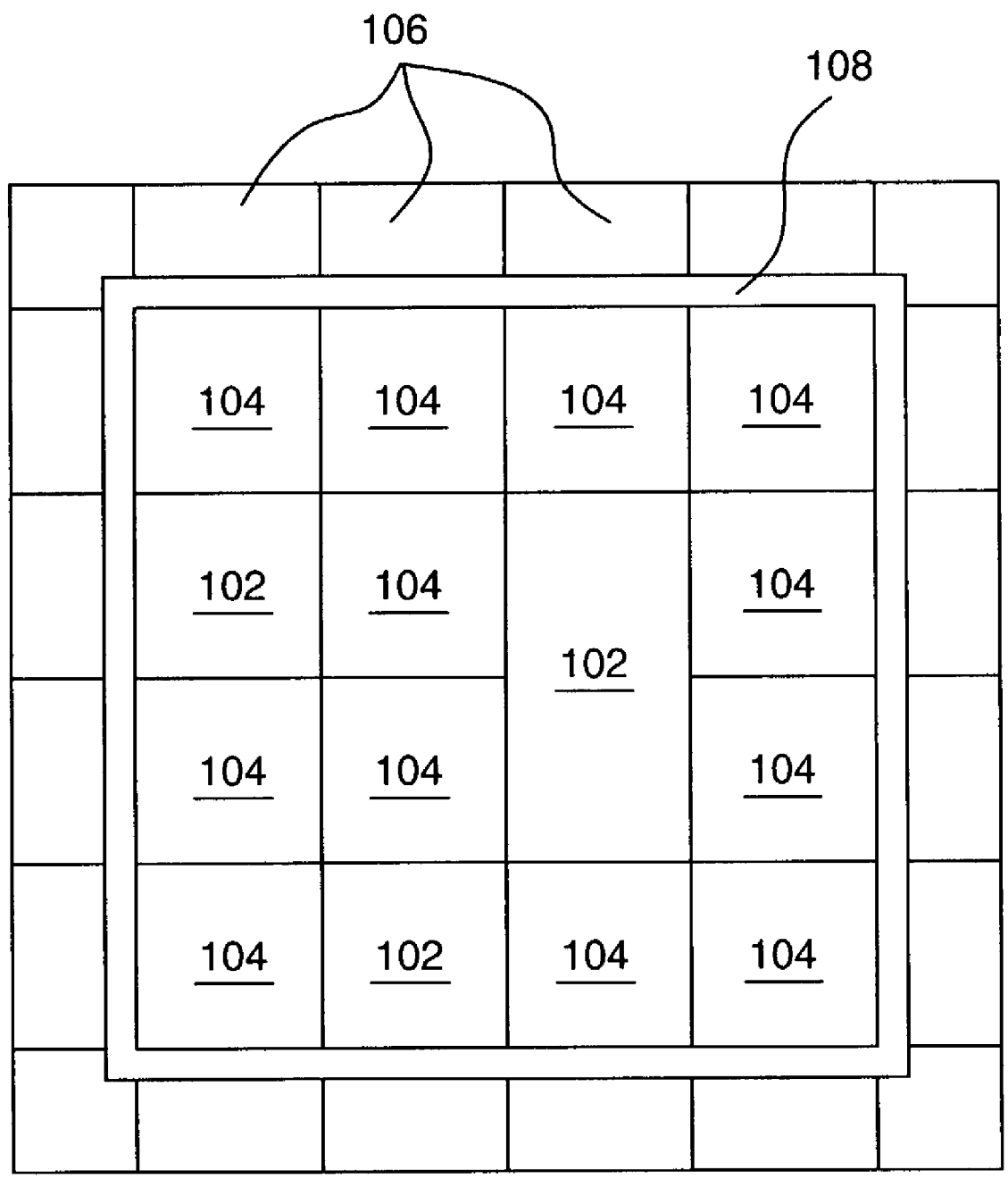
FIG. 1 depicts a schematic diagram showing an exemplary embodiment of a custom FPGA in accordance with one or more aspects of the invention.

FIG. 1 depicts a schematic diagram showing an exemplary embodiment of a custom FPGA 100 in accordance with one or more aspects of the invention. Custom FPGA 100 includes a ring of I/O blocks (IOBs) 106, a plurality of configurable logic blocks (CLBs) 104, an I/O routing ring 108, and a plurality of dedicated logic blocks 102.

As is well known in the art, CLBs 104 are programmably connectable to each other, and to I/O routing ring 108, for performing various types of logic functions. Each of CLBs 104 may include one or more "slices" and programmable interconnect circuitry (not shown). Each CLB slice conventionally includes various circuits, such as flip-flops, function generators (e.g., a look-up tables (LUTs)), logic gates, and like type well-known circuits.

IOBs 106 are configured to provide input to, and receive output from, one or more of CLBs 104. IOBs 106, CLBs 104, and I/O routing ring 108 are associated with configuration memory cells (not shown), the contents of which determine how IOBs 106, CLBs 104, and I/O routing ring 108 are configured. IOBs 106, CLBs 104, and I/O routing ring 108 are referred to herein as "programmable logic blocks". Custom FPGA 100 may include other types of logic blocks in addition to IOBs 106, CLBs 104, and I/O routing ring 108. For example, custom FPGA 100 may include digital clock management circuits (DCMs), delay lock loops (DLLs), memory (e.g., block RAM), multiplier blocks, and like types of well-known circuitry. One type of FPGA that may be used with the present invention is the Xilinx Virtex®-II Pro FPGA, which is described in detail in the "Virtex-II Pro Platform FPGAs: Functional Description", published Mar. 24, 2003, available from Xilinx, Inc., 2100 Logic Drive, San Jose, Calif. 95124, which is incorporated by reference herein in its entirety.

In an embodiment, CLBs 104 are disposed in a two-dimensional array and connect to each other by abutment. Connection by abutment is done by providing each CLB 104 with a known interface, by position, (x,y) location, interconnect level and signal, with respect to each CLB edge. Thus, a known interface exists at each edge of a CLB which is designed to be compatible with a corresponding edge of an adjacent CLB, namely, top-bottom, bottom-top, right-left, and left-right edge interface compatibility. When one CLB is placed next to another CLB, interfaces at adjoining edges are therefore able to electrically communicate signals, as well connect to power and ground. I/O routing ring 108 and IOBs 106 are disposed around the array of CLBs 104. The physical arrangement of programmable logic blocks within custom FPGA 100 is referred to herein as a "physical layout". The physical layout of IOBs 106, I/O routing ring 108, and CLBs 104 is exemplary of the types of physical layouts that may be employed within custom FPGA 100. In another example, a physical layout of programmable logic blocks may include block RAM and multiplier blocks disposed between multiple arrays of CLBs. Those skilled in the art will appreciate that other types of physical layouts may be employed within custom FPGA 100 and that the invention is not limited to those physical layouts disclosed herein.

Dedicated logic blocks 102 comprise hard-wired logic circuitry (other than DCMs, DLLs, and the like conventionally employed within an FPGA) for implementing custom logic functions. For example, dedicated logic blocks 102 may include microprocessors, digital signal processors (DSPs), communication circuits, memory, and like type well-known logic circuits.

As described in more detail below, a portion of the programmable logic blocks of custom FPGA 100 are removed to provide space for dedicated logic blocks 102. That is, space is reserved within the physical layout of custom FPGA 100 for dedicated logic blocks 102. The dedicated logic blocks 102 are placed within the reserved space and may be connected to adjacent programmable logic blocks. In an embodiment, the physical area of the reserved space corresponds to a physical area of one or more programmable logic blocks. For example, the physical area of the reserved space may comprise the physical area of one or more CLBs 104. This allows dedicated logic blocks 102 to be "drop-in" replacements for the removed CLBs 104. As drop-in replacements, dedicated logic blocks 102 may be connected to adjacent CLBs 104 by abutment. Thus, dedicated logic blocks 102 are designed with edge interfaces capable of connecting to one or more adjacent CLBs 104. Notably, not all connections need be made, as there may be one or more "no-connects" depending on implementation. This allows for a more seamless integration of dedicated logic blocks 102 at least partially within an array of CLBs 104 (as shown in FIG. 1, dedicated logic may border I/O routing ring 108). Notably, more CLB area may be removed than needed, and in those instances interface connects may be extended outwardly for abutment with neighboring CLBs 104.

Custom FPGA 100 provides for "islands" of dedicated logic circuitry within a "sea" of programmable logic circuitry. In other words, the area devoted to programmable logic circuitry is significantly larger than the disjoint areas devoted to dedicated logic circuitry. This is in contrast to conventional application specific integrated circuits (ASICs), where disjoint "islands" of FPGA circuitry may be embedded within a continuous "sea" of application specific integrated circuitry. The "island-of-FPGA" approach is not as well suited to reproduce the extensive routing and other circuits that are available in an FPGA. Notably, while the island-of-FPGA approach is capable of implementing user-defined logic via FPGA islands, the island-of-FPGA approach lacks the programmable routing for programmably connecting the FPGA islands. That is, in an ASIC with embedded islands of programmable logic, the connection between islands, or between an island and the ASIC, is fixed.

In contrast, custom FPGA 100 allows for programmable connection of user-defined logic. The islands of dedicated logic circuitry within custom FPGA 100 may be programmably connected to each other or to the FPGA fabric. With custom FPGA 100, benefits associated with an FPGA are available and are combined with additional benefits of custom dedicated logic circuitry. Notably, the term "custom" has been used herein to describe FPGA 100, however, it should be appreciated that the term "custom" merely refers to an FPGA having customer specified (i.e., user defined) dedicated logic circuitry in place of one or more programmable logic modules. This is to be contrasted with programmable devices where, for example, a vender-selected third party device, such as a microprocessor, is embedded in an FPGA for mass production.

A portion of a design may be fabricated in dedicated logic thereby avoiding programming an FPGA integrated circuit to perform what is done by dedicated logic circuitry. This reduces risk of reverse engineering, as it is substantially more difficult to reverse engineer logic formed within an FPGA than to reverse engineer the same logic in a hardware description language (HDL) listing. Moreover, dedicated logic avoids the use of bitstreams for implementing software-based custom logic functions, such software-based functions being susceptible to unauthorized use.

Figure 2:
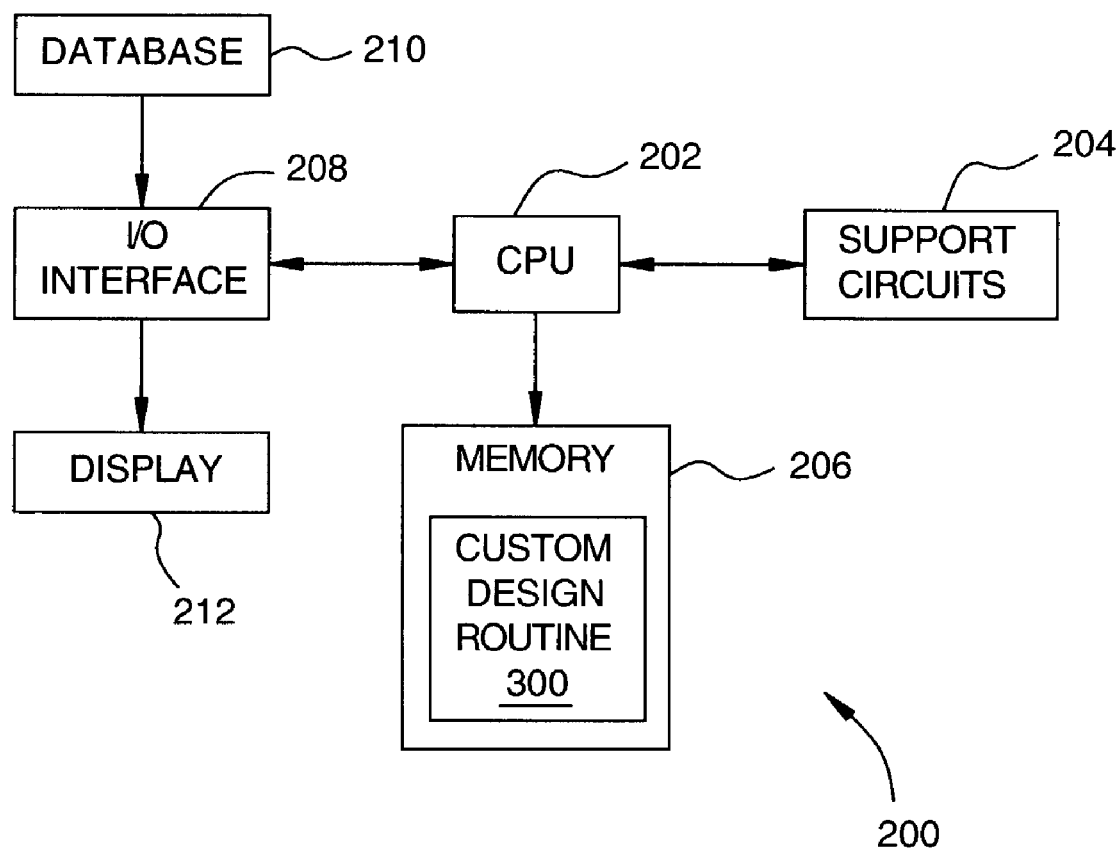
FIG. 2 depicts a block diagram showing an exemplary embodiment of an FPGA design system in accordance with one or more aspects of the invention.

FIG. 2 depicts a block diagram showing an exemplary embodiment of an FPGA design system 200 in accordance with one or more aspects of the invention. FPGA design system 200 includes a central processing unit (CPU) 202, a memory 206, a variety of support circuits 204, and an I/O interface 208. CPU 202 may be any type of microprocessor known in the art. Support circuits 204 for CPU 202 include conventional cache, power supplies, clock circuits, data registers, I/O interfaces, and the like. I/O interface 208 may be directly coupled to memory 206 or coupled through CPU 202, and may be coupled to a conventional keyboard, mouse, printer, and interface circuitry adapted to receive and transmit data, such as data files and the like. I/O interface 208 may be coupled to a display 212. Memory 206 includes read/write random access memory (RAM), read only memory (ROM), hard disk storage, floppy disk storage, or optical disk storage, or any combination of these devices.

Figure 3:
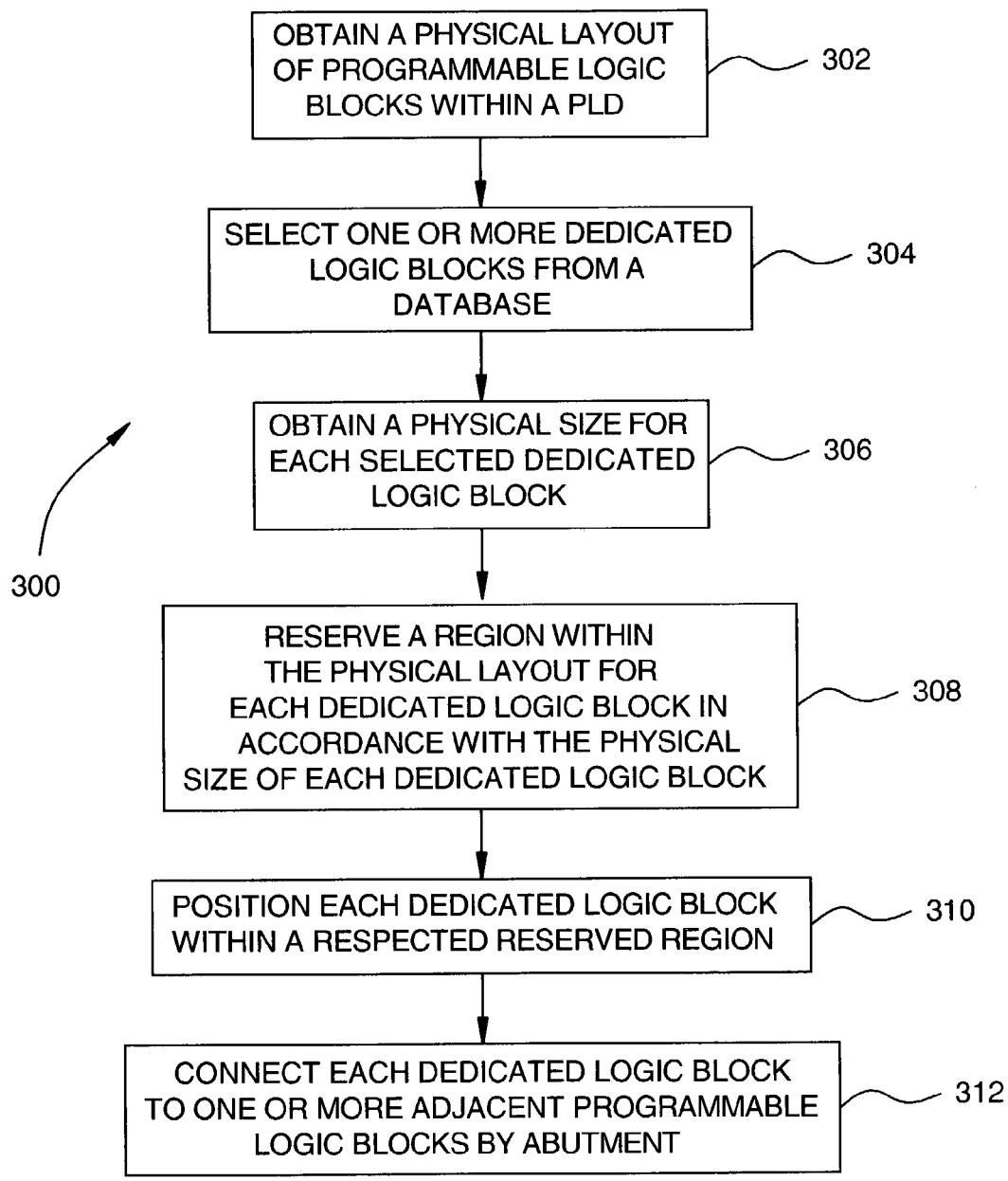
FIG. 3 depicts a flow diagram showing an exemplary embodiment of a process for designing a custom FPGA in accordance with one or more aspects of the invention.

Memory 206 may store all or portions of one or more programs and/or data for custom design routine 300 of FIG. 3. Although FPGA design system 200 has been disclosed as being implemented as computer executing a software program, those skilled in the art will appreciate that FPGA design system may be implemented in hardware, software, or a combination of hardware and software. Such implementations may include a number of processors independently executing various programs and dedicated hardware, such as application specific integrated circuits (ASICs).

I/O interface 208 may be further coupled to a database 210. Database 210 may be stored with RAM, ROM, hard disk storage, floppy disk storage, or optical disk storage, or any combination of these devices. Database 210 may include a catalog of dedicated logic blocks that may be used to implement custom logic functions within an FPGA. In an embodiment, dedicated logic blocks are stored within database 210 using an HDL, such as Very high-speed Hardware Description language (VHDL) or Verilog. Alternatively, dedicated logic blocks may be stored within database 210 in schematic form. Database 210 may also store interconnection information associated with the dedicated logic blocks in the form of a wire list or like type netlist known in the art.

FIG. 3 depicts a flow diagram showing an exemplary embodiment of a process 300 for designing a custom FPGA in accordance with one or more aspects of the invention. Process 300 may be executed by FPGA design system 200. Process 300 begins at step 302, where a physical layout of programmable logic blocks is obtained. In an embodiment, the programmable logic blocks include IOBs, CLBs, and I/O routing. An exemplary physical layout of programmable logic blocks is shown in FIG. 1. Notably, CLBs are formed into a two-dimensional array and connect to each other by abutment. I/O routing and IOBs are disposed in a ring around the CLBs. Those skilled in the art will appreciate that other types of physical layouts may be used with the invention.

At step 304, one or more dedicated logic blocks are selected from a database. As described above, dedicated logic blocks are used to implement custom logic functions. At step 306, a physical size is obtained for each dedicated logic block selected in step 304. At step 308, a region is reserved within the physical layout of programmable logic blocks for each dedicated logic block selected in step 304. The physical area of each region reserved in step 308 corresponds with the physical area of a respective one of the dedicated logic blocks selected in step 304. In an embodiment, the physical area of each region reserved in step 308 further corresponds with a physical area of one or more of the programmable logic blocks, such as CLBs. As described above, this allows the dedicated logic blocks to be "drop-in" replacements for the programmable logic blocks.

At step 310, each dedicated logic block selected in step 304 is positioned within a respective one of the regions reserved in step 308. At step 312, each dedicated logic block selected in step 304 is connected to one or more adjacent programmable logic blocks. For example, the dedicated logic blocks may connect to adjacent CLBs by abutment.

Custom design process 300 may be used to produce a custom programmable logic device, for example, custom FPGA 100 shown in FIG. 1. A design produced by custom design process 300 may be used with well-known mask fabrication techniques to produce a custom mask set for an FPGA. The custom mask set may then be used to fabricate custom FPGAs using well-known semiconductor processing techniques.

Alternatively, a design produced by custom design process 300 may be employed in a "maskless" fabrication process. As used herein, maskless manufacturing refers to integrated circuit fabrication without the use of function-specific hardware tooling. As understood by those skilled in the art, in a maskless fabrication process, the lithographic process of a conventional mask fabrication process is replaced by a scanning electron beam that selectively exposes a photoresist. Thus, in a maskless process, the "mask" becomes a computer file corresponding to a design produced using custom design process 300.

In addition, custom design process 300 allows for seamless integration of dedicate logic circuitry within programmable logic circuitry of a programmable logic device, such as an FPGA. The use of dedicated logic circuitry to implement custom logic functions obviates the need to implement custom logic functions using software with the programmable logic device.

FPGA design system 200 may be part of a computer system programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 206. Memory 206 may include one or more of the following random access memory, read only memory, magneto-resistive read/write memory, optical read/write memory, cache memory, magnetic read/write memory, and the like.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of designing for fabrication a custom programmable logic device, comprising:
   obtaining a physical layout of programmable logic blocks;
   selecting one or more dedicated logic blocks from a database;
   wherein each dedicated logic block implements a custom logic function in hardwired circuitry without programming a programmable logic block;
   obtaining a physical size for each of the one or more dedicated logic blocks selected;
   reserving a region within the physical layout for each of the one or more dedicated logic blocks in response to the physical size of each of the one or more dedicated logic blocks, respectively;
   wherein each region is assigned at least one of the programmable logic blocks in the physical layout;
   positioning each of the one or more dedicated logic blocks within the respective region reserved; and
   wherein the one or more dedicated logic blocks positioned within a respective region replaces programmable logic blocks within the respective region.

2. The method of claim 1, further comprising connecting the one or more dedicated logic blocks to one or more of the programmable logic blocks.

3. The method of claim 1, wherein the one or more dedicated logic blocks are connected to one or more of the programmable logic blocks by abutment.

4. The method of claim 1, wherein the physical layout of programmable logic blocks comprises a two-dimensional array of configurable logic blocks.

5. The method of claim 4, wherein the region reserved for each of the one or more dedicated logic blocks is at least partially within the two-dimensional array of configurable logic blocks.

6. The method of claim 5, wherein the one or more dedicated logic blocks are connected to one or more of the configurable logic blocks by abutment.

7. A computer readable medium having stored thereon instructions that, when executed by a processor, cause the processor to perform a method of designing for fabrication a custom programmable logic device, the method comprising:
obtaining a physical layout of programmable logic blocks;
selecting one or more dedicated logic blocks from a database;
wherein each dedicated logic block implements a custom logic function in hardwired circuitry without programming a programmable logic block;
obtaining a physical size for each of the one or more dedicated logic blocks selected;
reserving a region within the physical layout for each of the one or more dedicated logic blocks in response to the physical size of each of the one or more dedicated logic blocks, respectively;
wherein at least one of the programmable logic blocks in the physical layout occupies each region;
positioning each of the one or more dedicated logic blocks within the respective region reserved; and
wherein the one or more dedicated logic blocks positioned within a respective region replaces programmable logic blocks within the respective region.

8. An apparatus for designing for fabrication of a custom programmable logic device, comprising:
means for obtaining a physical layout of programmable logic blocks;
means for selecting one or more dedicated logic blocks from a database;
wherein each dedicated logic block implements a custom logic function in hardwired circuitry without programming a programmable logic block;
means for obtaining a physical size for each of the one or more dedicated logic blocks selected;
means for reserving a region within the physical layout for each of the one or more dedicated logic blocks in response to the respective physical size of each of the one or more dedicated logic blocks;
wherein at least one of the programmable logic blocks in the physical layout occupies each region;
means for positioning each of the one or more dedicated logic blocks within the respective region reserved; and
wherein the one or more dedicated logic blocks positioned within a respective region replaces programmable logic blocks within the respective region.

9. A system for designing for fabrication a custom programmable logic device, comprising:
a processing unit having access to one or more storage devices;
at least a portion of the one or more storage devices having a description of a physical layout of programmable logic blocks and having a database including a description of one or more dedicated logic blocks;
at least another portion of the one or more storage devices having a program product configured to:
obtain the physical layout of programmable logic blocks;
select a dedicated logic block of the one or more dedicated logic blocks from the database;
wherein each dedicated logic block implements a custom logic function in hardwired circuitry without programming a programmable logic block;
obtain a physical size of the dedicated logic block selected from the database;
reserve a region within the physical layout for the dedicated logic block in response to the physical size obtained;
wherein at least one of the programmable logic blocks in the physical layout occupies each region;
position the dedicated logic block within the region reserved; and
wherein the one or more dedicated logic blocks positioned within a respective region replaces programmable logic blocks within the respective region.

10. A method for designing for fabrication a programmable logic device, comprising:
determining a first size of a physical layout of a hardwired logic circuit from a specification of the hardwired logic circuit;
selecting, as a function of the first size and from an area defined by layout information that specifies a physical layout of programmable logic resources on a semiconductor chip, a sub-area assigned to a subset of the programmable logic resources;
removing the subset of programmable logic resources from the sub-area; and
establishing information that specifies placement of the hardwired logic circuit in the sub-area.

11. The method of claim 10, further comprising establishing information describing a connection of the hardwired logic circuit to at least one of the programmable logic resources.

12. The method of claim 10, wherein the layout information of the programmable logic resources specifies a two-dimensional array of configurable logic blocks.

13. The method of claim 12, wherein the sub-area is partially surrounded by configurable logic blocks in the two-dimensional array of configurable logic blocks.

14. The method of claim 12, wherein the sub-area is surrounded by configurable logic blocks in the two-dimensional array of configurable logic blocks.

* * * * *